US010763896B2

(12) United States Patent
Peng et al.

(10) Patent No.: US 10,763,896 B2
(45) Date of Patent: *Sep. 1, 2020

(54) CONSTRUCTION METHOD FOR (N,N(N-1),N-1) PERMUTATION GROUP CODE BASED ON COSET PARTITION AND CODEBOOK GENERATOR THEREOF

(71) Applicant: HUAZHONG UNIVERSITY OF SCIENCE AND TECHNOLOGY, Wuhan, Hubei (CN)

(72) Inventors: Li Peng, Hubei (CN); Gaofeng Li, Hubei (CN); Jiaolong Wei, Hubei (CN); Kun Liang, Hubei (CN); Bo Zhou, Hubei (CN)

(73) Assignee: HUAZHONG UNIVERSITY OF SCIENCE AND TECHNOLOGY, Wuhan, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,947

(22) Filed: Jan. 31, 2019

(65) Prior Publication Data

US 2019/0165814 A1    May 30, 2019

Related U.S. Application Data

(63) Continuation of application No. 15/060,111, filed on Mar. 3, 2016, now Pat. No. 10,230,397.

(30) Foreign Application Priority Data

Jan. 26, 2016    (CN) .......................... 2016 1 0051144

(51) Int. Cl.
*H03M 13/15*    (2006.01)
*H03M 13/03*    (2006.01)
(Continued)

(52) U.S. Cl.
CPC ..... *H03M 13/1525* (2013.01); *H03M 13/033* (2013.01); *H03M 13/15* (2013.01);
(Continued)

(58) Field of Classification Search
CPC ............ H03M 13/1525; H03M 13/617; H04L 49/3027; H04B 3/542
See application file for complete search history.

(56) References Cited

PUBLICATIONS

A. J. Han Vinck, "Coded Modulation for Power Line Communications," in AEU Journal, Jan. 2000, p. 45-49.

*Primary Examiner* — April Y Blair
*Assistant Examiner* — Rong Tang
(74) *Attorney, Agent, or Firm* — Hamre, Schumann, Mueller & Larson, P.C.

(57) ABSTRACT

A construction method for a (n,n(n−1),n−1) permutation group code based on coset partition is provided. The presented (n,n(n−1),n−1) permutation group code has an error-correcting capability of d−1 and features a strong anti-interference capability for channel interferences comprising multi-frequency interferences and signal fading. As n is a prime, for a permutation code family with a minimum distance of n−1 and a code set size of n(n−1), the invention provides a method of calculating n−1 orbit leader permutation codewords by $O_n = \{\alpha o_1\}_{\alpha=1}^{n-1} \pmod{n}$ and enumerating residual codewords of the code set by $P_n = C_n O_n = \{(l_1)^{n-1} O_n\} = \{(r_n)^{n-1} O_n\}$. Besides, a generator of the code set thereof is provided. The (n,n(n−1),n−1) permutation group code of the invention is an algebraic-structured code, n−1 codewords of the orbit leader array can be obtained simply by adder and (mod n) calculator rather than multiplication of positive integers. Composition operations of the cyclic subgroup $C_n$ acting on all permutations $o_\alpha$ of the orbit leader permutation array $O_n$ are replaced by well-defined cyclic shift composite operation functions $(l_1)^{n-1}$ and $(r_n)^{n-1}$ so that (Continued)

the action of the cyclic group acting on permutations is realized by a group of cyclic shift registers.

9 Claims, 4 Drawing Sheets

(51) Int. Cl.
*H03M 13/00* (2006.01)
*H04L 12/935* (2013.01)
*H04B 3/54* (2006.01)

(52) U.S. Cl.
CPC ....... *H03M 13/611* (2013.01); *H03M 13/617* (2013.01); *H04L 49/3027* (2013.01); *H04B 3/542* (2013.01)

CONSTRUCTION METHOD FOR (N,N(N−1),N−1) PERMUTATION GROUP CODE BASED ON COSET PARTITION AND CODEBOOK GENERATOR THEREOF

FIELD OF THE INVENTION

The invention relates to a technical field of channel coding in communication transmission, and more particularly to a construction method for a (n,n(n−1),n−1) permutation group code based on coset partition and a codebook generator thereof.

BACKGROUND OF THE INVENTION

Multiple interferences comprising multipath fading, permanent narrow-band noise, broadband impulse noise and colored background noises may coexist in a power line channel, which is uncommon for wireless and wired channels. Therefore, information transmission reliability is hard to be guaranteed by applying existing technology of wireless and wired communications directly to power line carrier communication channels, and it is necessary to propose a solution of error-correcting codes with higher reliability to interferences of multiple forms and multiple frequencies in power line carrier communication. Besides, error-correcting codes with higher reliability are still needed for wider wireless transmission environment with interferences of multiple forms and multiple frequencies.

In 2000, Vinck introduced permutation codes into power line carrier communication, and a corresponding dissertation "'Coded modulation for power line communications', AEU int. J. Electron. Commun., vol. 54, no. 1, pp: 45-49, 2000" discloses a power line carrier coded modulation method combining permutation code and M-dimension FSK modulation, where time diversity and frequency diversity are introduced simultaneously at a transmitter terminal according to redundancy of permutation codes to increase capability of resisting fading and interferences of multiple frequencies, and a receiving signal is detected by a constant envelope demodulation algorithm at a receiver terminal to form a simple non-coherent demodulation method. It should be noted that Vinck came to a conclusion that permutation codes have an error-correcting capability of d−1 rather than $\lfloor (d-1)/2 \rfloor$ through analyzing a permutation code with code length of 4. However, Vinck failed to provide an effective construction method for permutation codes. At present, permutation codes with an error-correcting capability of d−1 develop slowly and are not applied in practice for design methods for algebraic structures of permutation codes are rare and more particularly, the problem of their executable circuits has not been effectively solved yet.

SUMMARY OF THE INVENTION

In view of the above-mentioned problems, it is an objective of the invention to provide a construction method of (n,n(n−1),n−1) permutation group code based on coset partition and a codebook generator thereof. More specifically, there is provided an algebraic structural design method and a codebook enumerator for permutation codes with a code length of n, a minimum distance of n−1, a cardinality of n(n−1) and an error-correcting capability of d−1=n−2. For multiple interferences comprising multipath fading, permanent narrow-band noise, broadband impulse noise and colored background noises may coexist in a power line channel, the invention provides a design method for an error-correcting code capable of resisting the mixed interferences. Besides, the permutation group code of the invention features a strong anti-interference capability for multi-frequency interferences in wireless communication and malicious frequency interferences from a human being, and is capable of protecting transmitted signals under the circumstance with low requirement for data rate and coexisted deep fading and various mixed frequency interferences. To achieve the above objective, according to one embodiment of the invention, there is provided a construction method of the (n,n(n−1),n−1) permutation group codes based on coset partition, wherein a construction of this permutation code with a code length of n, a minimum distance of n−1 and a code size of n(n−1) is expressed by $P_n = \{\{p_{\beta\alpha}\}_{\beta=1}^n\}_{\alpha=1}^{n-1} = C_n O_n = \{\{C_n o_1\}, \{C_n o_2\}, \ldots, \{C_n o_{n-1}\}\} = \{\{c_\beta \circ o_\alpha\}_{\beta=1}^n\}_{\alpha=1}^{n-1}$, $P_n = C_n O_n$ represents that $C_n$ is a coset of the subgroup $O_n$ and $O_n$ is also a coset of the subgroup $C_n$, $P_n = \{\{C_n o_1\}, \{C_n o_2\}, \ldots, \{C_n o_{n-1}\}\}$ represents dividing $P_n$ into n−1 cosets by the subgroup $C_n$, each coset $\{C_n o_\alpha\}$ forms an orbit or an cyclic Latin square (C-LS) of a permutation $o_\alpha$, $P_n = \{\{p_{\beta\alpha}\}_{\beta=1}^n\}_{\alpha=1}^{n-1} = \{\{c_\beta \circ o_\alpha\}_{\beta=1}^n\}_{\alpha=1}^{n-1}$ represents a permutation code and each codeword $P_{\beta\alpha}$ is generated by composition operation of a permutation $c_\beta$ of the subgroup $C_n$ and a permutation $o_\alpha$ of the subgroup $O_n$, $\alpha=1, 2, \ldots n-1$, and $\beta=1, 2, \ldots n$.

According to another embodiment of the invention, there is provided a generator of the (n,n(n−1),n−1) permutation group code based on coset partition, comprising an orbit leader array generator, a flash memory and a cyclic-bidirectional-shift register group, wherein the orbit leader array generator is operable for performing an operation of $O_n = \{\alpha o_1\}_{\alpha=1}^{n-1} \pmod{n}$ to generate n−1 orbit leader permutations;

the flash memory is operable for storing output results of the orbit leader array generator and the cyclic-bidirectional-shift register group; and the cyclic-bidirectional-shift register group is operable for performing the operation of $(l_1)^{n-1}$ or $(r_n)^{n-1}$ acting on a permutation by calculating an orbit $\{(l_1)^{n-1} o_\alpha\}$ or $\{(r_n)_{n-1} o_\alpha)\}$ of an orbit leader permutation $o_\alpha$, and a code set $\{(l_1)^{n-1} O_n\}$ or $\{(r_n)^{n-1} O_n\}$, where $\alpha=1, 2, \ldots, n-1$.

The (n,n(n−1),n−1) permutation group code based on coset partition of the invention is an algebraic-structured code, the orbit leader permutation codewords of the code set can be obtained simply by adder and (mod n) calculator instead of complex composition operations, and the whole code set can be realized by a group of cyclic shift registers. As a non-binary error-correcting code, the permutation code has an error-correcting capability of d−1, two times that of non-binary error-correcting codes in prior art. Demodulation can be realized simply by a noncoherent constant envelop detecting technology at a receiver terminal combining permutation code with MFSK modulation technology, and signal transmission reliability can be guaranteed for communication channels with deep fading and mixed frequency noises.

SPECIFIC EMBODIMENTS OF THE INVENTION

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

Basic Principles

Basic principles of a (n,n(n−1),n−1) permutation group code based on coset partition of the invention are given below.

Code symbols can take values in two finite fields, namely, $Z_n^0=\{0, 1, \ldots, n-1\}$ represents a finite field of order n containing element 0, and $Z_n^1=\{1, 2, \ldots, n\}$ represents a finite positive integer field of order n containing no element 0, and is also a cyclic group of order n.

Calling a set formed by all n! permutations of n elements in $Z_n^0$ or $Z_n^1$ a symmetric group $S_n=\{\pi_1, \ldots, \pi_k, \ldots, \pi_{n!}\}$, an element of $S_n$ can be represented by a permutation $\pi_k=[a_1 \ldots a_i \ldots a_n]$, elements of a permutation by $a_1 \ldots a_i \ldots a_n \in Z_n^0$ or $a_1 \ldots a_i \ldots a_n \in Z_n^1$, degree (dimension) of a permutation is $|\pi_k|=n$, and cardinality (order) of the symmetric group is $|S_n|=n!$. Let $\pi_0=e=[a_1 a_2 \ldots a_n]=[01 \ldots n-1]$ or $\pi_0=e=[a_1 a_2 \ldots a_n]=[12 \ldots n]$ represent an identity element of the symmetric group $S_n$, where $[a_1 a_2 \ldots a_n]$ represent a permutation in $S_n$, and $(a_1 a_2 \ldots a_n)$ represents a permutation operator.

A group H is a cyclic permutation group if H can be generated by a single element, i.e., there is an element $x \in H$ such that $H=\{x^i | i \in Z_n^1, x, x^i \in S_n\}$. We shall write $H=\langle x \rangle$ and say that H is generated by x or x is a generator of H.

Let $\gamma=(\gamma_2)$ be a cyclic permutation group of n permutation operators, its generator is $\gamma_2=(a_2 a_3 \ldots a_n a_1)$, and its cardinality is $|\gamma|=n$. If making the operator set $\gamma=(\gamma_2)$ act on a permutation $\pi=[a_1 \ldots a_i \ldots a_n]$, we get $\{\gamma\pi\}=\{\{\gamma_2, \gamma_3, \ldots, \gamma_n, \gamma_1\}[a_1 \ldots a_i \ldots a_n]\}=\{\langle\gamma_2\rangle\pi\}=\{\{\gamma_2, \gamma_2^2, \ldots, \gamma_n, \gamma_1\}[a_1 \ldots a_i \ldots a_n]\}$, then $\{\gamma\pi\}$ is regarded as an orbit containing permutation $\pi$ under the action of cyclic permutation group $\gamma$ and element number of the orbit $\{\gamma\pi\}$ is $|\{\gamma\pi\}|=n$.

Basic structure of the (n,n(n−1),n−1) permutation group code based on coset partition is provided by the following two Theorems and a Lemma without a proof.

Lemma 1 [construction of $C_n$]: $C_n=\{c_1, c_2, \ldots, c_n\}=\langle c_2 \rangle$ is a subgroup of $S_n$ and also a cyclic permutation group with minimum distance $d_{C_n}=n$ and cardinality $|C_n|=n$ if and only if (i) $C_n=\{\gamma\pi\}=\{\langle\gamma_2\rangle[a_1 a_2 \ldots a_n]\}$; (ii) its subscript is specified to keep consistent with the value of the first element of each permutation in $C_n$, i.e., $c_1=\gamma_1\pi=c_2^n=\gamma_2^n\pi=(a_2 a_3 \ldots a_n a_1)^n[a_1 a_2 \ldots a_n]=[a_1 a_2, \ldots, a_n]$, $c_2=\gamma_2\pi=[a_2 a_3 \ldots a_n a_1]$, $c_3=\gamma_3\pi=c_2^2=\gamma_2^2\pi=(a_2 a_3 \ldots a_n a_1)^2[a_1 a_2 \ldots a_n]=[a_3 a_4 \ldots a_n a_1 a_2], \ldots, c_n=\gamma_n\pi=c_2^{n-1}=\gamma_2^{n-1}\pi=(a_2 a_3 \ldots a_n a_1)^{n-1}[a_1 a_2 \ldots a_n]=[a_n a_1 a_2 \ldots a_{n-1}]$.

Theorem 2 [construction of $O_n$]: Let $O_n$ be a (n−1)×n permutation array or a set formed by n−1 permutations, and construct $O_n=\{o_\alpha\}_{\alpha=1}^{n-1}=\{\alpha \cdot o_1\}_{\alpha=1}^{n-1}$, where $o_1=[12 \ldots n]$ is an identity permutation, and $\alpha=1, 2, \ldots, n-1$ is the row index of permutation array $O_n$, also as an index of the number of permutations in the set $O_n$. If and only if i) n is a prime; ii) for all $\alpha=1, 2, \ldots, n-1$, we have $(\alpha \cdot n)(\bmod n)=n$; then the set $O_n$ is a subgroup of $S_n$, all elements of the nth column in the array $O_n$ are n, and the minimum distance of $O_n$ is $d_{O_n}=n-1$ and its cardinality is $|O_n|=n-1$.

Theorem 3 [constructing a permutation group code $P_n$ by $C_n$ and $O_n$]: For any prime n, let $P_n=\{p_{11}, \ldots, p_{\beta\alpha}, \ldots, p_{n(n-1)}\}$ be a nontrivial subgroup of $S_n$, we use the composition of $C_n$ and $O_n$ to construct $P_n$, i.e., $P_n=\{\{p_{\beta\alpha}\}_{\beta=1}^n\}_{\alpha=1}^{n-1}=C_n O_n=\{\{c_\beta \circ o_\alpha\}_{\beta=1}^n\}_{\alpha=1}^{n-1}$, where $c_\beta \circ o_\alpha$ denotes a composition operation between a permutation $c_\beta \in C_n$ and a permutation $o_\alpha \in O_n$. If $C_n \cap O_n = e = [12 \ldots n]$, then $P_n$ is a permutation group code with the minimum Hamming distance $d_{P_n}=n-1$ and cardinality $|P_n|=n(n-1)$ in which $C_n$ is a left coset of $O_n$ and $O_n$ is a right coset of $C_n$.

Example 1

Let n=5, and $C_5$ is obtained by Lemma 1 as follows:

$$C_5 = \begin{Bmatrix} c_1, \\ c_2, \\ c_3, \\ c_4, \\ c_5 \end{Bmatrix} = \langle c_2 \rangle = \begin{Bmatrix} c_2^5, \\ c_2^1, \\ c_2^2, \\ c_2^3, \\ c_2^4 \end{Bmatrix} = \langle \gamma_2 \pi \rangle = \begin{Bmatrix} \gamma_2^5 \pi, \\ \gamma_2^1 \pi, \\ \gamma_2^2 \pi, \\ \gamma_2^3 \pi, \\ \gamma_2^4 \pi \end{Bmatrix} =$$

$$\begin{Bmatrix} (a_2 a_3 a_4 a_5 a_1)^5 [a_1 a_2 a_3 a_4 a_5], \\ (a_2 a_3 a_4 a_5 a_1)[a_1 a_2 a_3 a_4 a_5], \\ (a_2 a_3 a_4 a_5 a_1)^2 [a_1 a_2 a_3 a_4 a_5], \\ (a_2 a_3 a_4 a_5 a_1)^3 [a_1 a_2 a_3 a_4 a_5], \\ (a_2 a_3 a_4 a_5 a_1)^4 [a_1 a_2 a_3 a_4 a_5] \end{Bmatrix} = \begin{Bmatrix} a_1 a_2 a_3 a_4 a_5, \\ a_2 a_3 a_4 a_5 a_1, \\ a_3 a_4 a_5 a_1 a_2, \\ a_4 a_5 a_1 a_2 a_3, \\ a_5 a_1 a_2 a_3 a_4 \end{Bmatrix} = \begin{Bmatrix} 12345, \\ 23451, \\ 34512, \\ 45123, \\ 51234 \end{Bmatrix}$$

$O_5$ in a form of permutation array is obtained by Theorem 2 as follows:

$$O_5 = \begin{bmatrix} o_1 \\ o_2 \\ o_3 \\ o_4 \end{bmatrix} = \begin{bmatrix} 1 o_1 \\ 1 o_2 \\ 3 o_1 \\ 4 o_1 \end{bmatrix} = \begin{bmatrix} 1 \cdot 1 & 1 \cdot 2 & 1 \cdot 3 & 1 \cdot 4 & 1 \cdot 5 \\ 2 \cdot 1 & 2 \cdot 2 & 2 \cdot 3 & 2 \cdot 4 & 2 \cdot 5 \\ 3 \cdot 1 & 3 \cdot 2 & 3 \cdot 3 & 3 \cdot 4 & 3 \cdot 5 \\ 4 \cdot 1 & 4 \cdot 2 & 4 \cdot 3 & 4 \cdot 4 & 4 \cdot 5 \end{bmatrix}$$

$$(\bmod\ 5) = \begin{bmatrix} 1 & 2 & 3 & 4 & 5 \\ 2 & 4 & 6 & 8 & 10 \\ 3 & 6 & 9 & 12 & 15 \\ 4 & 8 & 12 & 16 & 20 \end{bmatrix} (\bmod\ 5) = \begin{bmatrix} 1 & 2 & 3 & 4 & 5 \\ 2 & 4 & 1 & 3 & 5 \\ 3 & 1 & 4 & 2 & 5 \\ 4 & 3 & 2 & 1 & 5 \end{bmatrix}$$

So that $O_5$ in a form of set is obtained as follows:

$$O_5 = \begin{Bmatrix} o_1 \\ o_2 \\ o_3 \\ o_4 \end{Bmatrix} = \begin{Bmatrix} a_1 a_2 a_3 a_4 a_5, \\ a_2 a_4 a_1 a_3 a_5, \\ a_3 a_1 a_4 a_2 a_5, \\ a_4 a_3 a_2 a_1 a_5 \end{Bmatrix} = \begin{Bmatrix} 12345, \\ 24135, \\ 31425, \\ 43215 \end{Bmatrix}.$$

Let $c_1=o_1=e=[12345]$, and $P_5$ is obtained by Theorem 3 as follows:

$$P_5 = \{\{p_{\beta\alpha}\}_{\beta=1}^5\}_{\alpha=1}^4 = \{\{C_5 o_1\}, \{C_5 o_2\}, \{C_5 o_3\}, \{C_5 o_4\}\} =$$

-continued $$\{\{c_\beta \circ o_\alpha\}_{\beta=1}^5\}_{\alpha=1}^4 = \begin{Bmatrix} c_1 \circ o_1, & c_1 \circ o_2, & c_1 \circ o_3, & c_1 \circ o_4, \\ c_2 \circ o_1, & c_2 \circ o_2, & c_2 \circ o_3, & c_2 \circ o_4, \\ c_3 \circ o_1, & c_3 \circ o_2, & c_3 \circ o_3, & c_3 \circ o_4, \\ c_4 \circ o_1, & c_4 \circ o_2, & c_4 \circ o_3, & c_4 \circ o_4, \\ c_5 \circ o_1, & c_5 \circ o_2, & c_5 \circ o_3, & c_5 \circ o_4, \end{Bmatrix} =$$

$$\begin{Bmatrix} a_1a_2a_3a_4a_5, & a_2a_4a_1a_3a_5, & a_3a_1a_4a_2a_5, & a_4a_3a_2a_1a_5, \\ a_2a_3a_4a_5a_1, & a_3a_4a_2a_4a_1, & a_4a_2a_5a_3a_1, & a_5a_4a_3a_2a_1, \\ a_3a_4a_5a_1a_2, & a_4a_1a_3a_5a_2, & a_5a_3a_1a_4a_2, & a_1a_5a_4a_3a_2, \\ a_4a_5a_1a_2a_3, & a_5a_2a_4a_1a_3, & a_1a_4a_2a_5a_3, & a_2a_1a_5a_4a_3, \\ a_5a_1a_2a_3a_4, & a_1a_3a_5a_2a_4, & a_2a_5a_3a_1a_4, & a_3a_2a_1a_5a_4 \end{Bmatrix} =$$

$$\begin{Bmatrix} 12345, & 24135, & 31425, & 43215, \\ 23451, & 35241, & 42531, & 54321, \\ 34512, & 41352, & 53142, & 15432, \\ 45123, & 52413, & 14253, & 21543, \\ 51234, & 13524, & 25314, & 32154 \end{Bmatrix}$$

Example 1 illustrates $P_5$ is a permutation group code with a code length of 5, a minimum distance of 4, a code set size of 20 and an error-correcting capability of 3, and it can be seen that $P_5$ is formed by four orbits $\{C_5o_1\}$, $\{C_5o_2\}$, $\{C_5o_3\}$, $\{C_5o_4\}$.

Technical Solution

It is formed by two parts. The first part covers a construction method for a (n,n(n−1),n−1) permutation group code based on coset partition, and the second part covers a generator of this permutation group code thereof.

Part 1: a construction method for a (n,n(n−1),n−1) permutation group code based on coset partition.

In terms of Lemma 1 and Theorems 2 and 3, in the construction method for a (n,n(n−1),n−1) permutation group code based on coset partition, all codewords in the code set are calculated by $P_n=\{\{p_{\beta\alpha}\}_{\beta=1}^n\}_{\alpha=1}^{n-1}=C_nO_n=\{\{C_no_1\}, (C_no_2), \ldots, \{C_no_{n-1}\}\}=\{\{c_\beta \circ o_\alpha\}_{\alpha=1}^{n-1}\}_{\beta=1}^n$, where $P_n$ is a non-trivial subgroup of a symmetric group $S_n$, with a size of $|P_n|=n(n−1)$ and a minimum distance of $d_{|P_n|}$, $=n−1$, $C_n=\{c_1, \ldots, c_\beta, \ldots, c_n\}=\langle c_2\rangle$ is a subgroup of $P_n$ and also a cyclic group with a size of $|C_n|=n$ and a minimum distance of $d_{|C_n|}=n$, $\beta=1, 2, \ldots, n$, $O_n=\{o_1, \ldots, o_\alpha, \ldots, o_{n-1}\}$ is another subgroup of $P_n$ different from $C_n$ and also called as an orbit leader array of the (n,n(n−1),n−1) permutation group code, with a size of $|O_n|=n−1$ and a minimum distance of $d_{|O_n|}=n−1$, $\alpha=1, 2, \ldots, n−1$, and intersection of $C_n$ and $O_n$ is an identity permutation $(C_n \cap O_n=e)$. The code set $P_n$ is divided into n−1 cosets by the subgroup $C_n$ ($P_n=\{C_no_1, C_no_2, \ldots, C_no_{n-1}\}$), each coset $\{C_no_\alpha\}$ forms an orbit or an cyclic Latin square (C-LS) of a permutation $o_\alpha$.

Each codeword of the code set is calculated by $p_{\beta\alpha}=c_\beta \circ o_\alpha$ representing a composition operation between a permutation $c_\beta \in C_n$ and a permutation $o_\alpha \in O_n$, which is unfavorable for hardware realization, and therefore a circuit executable permutation operation function should be constructed. Since $C_n$ is a cyclic group, it is possible to substitute cyclic shift operation of a permutation for the action of $C_n$, so that composition operation of two permutations are equivalently transferred to cyclic shift operation of being able to be performed by basic unit circuit namely cyclic shift register. Therefore, operation function and composite operation function are defined first as follows.

Construction of Operation Function

Let T be a set of all operation functions available acting on a permutation, construct a right-shift operation function set $T_{right}=\{r_2, r_3, \ldots, r_{n-1}, r_n\} \subset T$, where each element $r_i \in T_{right}$ is a function $r_i: S_n \to S_n$ defined by $r_i\pi=r_i[a_1 \ldots a_i \ldots a_n]=[a_ia_1 \ldots a_{i-1}a_{i+1}, \ldots a_n] \in S_n$, and $r_i \in T_{right}$ is called as a partial cyclic right-shift operation function of a permutation. Especially for i=n, we have $r_n\pi=r_n[a_1a_2 \ldots a_n]=[a_na_1a_2 \ldots a_{n-1}] \in S_n$ and $r_n$ is called as a cyclic-right-shift operation function of a permutation. Similarly, construct a left-shift operation function set $T_{left}=\{l_1, l_2, \ldots, l_{n-1}\} \subset T$, where each element $l_j \in T_{left}$ is a function $l_j: S_n \to S_n$ defined by $l_j\pi=l_j[a_1 \ldots a_n]=[a_1 \ldots a_{j-1}a_{j+1} \ldots a_na_j] \in S_n$, and $l_j \in T_{left}$ is called as a partial cyclic left-shift operation function of a permutation. Especially for j=1, we have $l_1\pi=l_1[a_1a_2 \ldots a_n]=[a_2a_3 \ldots a_{n-1}a_na_1] \in S_n$ and $l_1$ is called as a cyclic-left-shift operation function of a permutation.

Construction of Cyclic Shift Composite Operation Function

Arrange part or all operation functions of the set $T_{left}$ or $T_{right}$ in a string or consecutive multiplication of powers of different functions, so that the operation function string or the product of function powers forms a composite operation function represented as $f_{CF}(u,\Lambda)$, where u is the number of operation functions in the composite operation function $f_{CF}(u,\Lambda)$, and $\Lambda$ is an arranging rule of the operation functions, which is: some a function is repeatedly used for $\lambda−1$ times, and as $\lambda=n$, a left cycle composite operation function is constructed as $$f_{CF-1}(n-1, \Lambda) = \underbrace{l_1l_1 \ldots l_1}_{n-1} = (l_1)^{n-1},$$

and a right cycle composite operation function is constructed as $$f_{CF-r}(n-1, \Lambda) = \underbrace{r_nr_n \ldots r_n}_{n-1} = (r_n)^{n-1}.$$

Performing the two composite operation functions on a permutation $\pi=[a_1a_2 \ldots a_n]$ respectively, two sets of n permutations are obtained as $\{(l_1)^{n-1}\pi\} \triangleq \{\pi, l_1\pi, l_1^2\pi, \ldots, l_1^{n-1}\pi\}$ and $\{(r_n)^{n-1}\pi\} \triangleq \{\pi, r_n\pi, r_n^2\pi, \ldots, r_n^{n-1}\pi\}$. $\{(l_1)_{n-1}\pi\}$ and $\{(r_n)^{n-1}\pi\}$ are two orbits of the permutation $\pi$ as the orbit $\{C_n\pi\}$, we have $\{C_n\pi\}=\{(l_1)^{n-1}\pi\}=\{(r_n)^{n-1}\pi\}$, namely, three orbits obtained by the three different operations form equivalence class but corresponding C-LSs are not equal each other because of different arrangement of permutations in these orbits.

As a result, the cyclic group $C_n$ of the code set $P_n=\{C_nO_n\}$ can be replaced by the left cycle composite operation function $(l_1)^{n-1}$ or the right cycle composite operation function $(r_n)^{n-1}$, each orbit $\{C_no_\alpha\}$ is obtained by $\{C_no_\alpha\}=\{(r_n)_{n-1}o_\alpha\}=\{(l_1)^{n-1}o_\alpha\}$, the expression enumerating all codewords is, $P_n=C_nO_n=\{(r_n)^{n-1}O_n\}=\{\{(r_n)^{n-1}o_1\}, \{(r_n)^{n-1}o_2\}, \ldots, \{(r_n)^{n-1}o_{n-1}\}\}=\{(l_1)^{n-1}O_n\}=\{\{(l_1)^{n-1}o_1\}, \{(l_1)^{n-1}o_2\}, \ldots, \{(l_1)^{n-1}o_{n-1}\}\}$. Structure features of the orbit leader array $O_n$ provided by Theorem 2 are analyzed below and several different design methods are provided thereafter.

Structure Features of the Orbit Leader Array $O_n$:

An orbit leader array of the presented (n,n(n−1),n−1) permutation group code has the following features: first, it is an array of (n−1)×n, each row thereof is a permutation of $S_n$, and an unique column thereof contains a same element $a_k=k$, where $k,a_k \in Z_n^0$ or $k,a_k \in Z_n^1$; second, removing the column containing the same element, residual rows and columns constitute a Latin square with a size of $(n-1)\times(n-1)$; and third, each row of the orbit leader array $O_n$ has n different adjacent pairs $(a_\mu, a_\nu)$ containing cyclic adjacent pairs, and the orbit leader array $O_n$ itself contains $n(n-1)$ different adjacent (or cyclic adjacent) pairs, $\mu$, $\nu$, $a_\mu$, $a_\nu \in Z_n^0$ or $\mu$, $\nu$, $a_\mu$, $a_\nu \in Z_n^1$, $a_\mu \neq a_\nu$, and $\mu \neq \nu$. Generally, $n(n-1)$ different pairs in a form of $(a_\mu, a_\nu)$ can be obtained as constructed by n positive integers, which is a sufficient condition for the orbit leader array containing $n(n-1)$ different adjacent pairs.

Design Method of the Orbit Leader Array $O_n$:

An orbit leader array meeting the above three structure features can be calculated by explicit expressions, and the following two design methods can be realized by hardwares for Theorem 2.

Method 1: A Permutation Contains Element 0

Let $a_{\alpha_1,\beta_1} \in Z_n^0 = \{0, 1, \ldots, n-1\}$ denote an element in the $\alpha_1$th row and the $\beta_1$th column of an array $O_{n1}$, where $\alpha_1 = 0, 1, \ldots, n-2$ denotes the row index of the array $O_{n1}$, $\beta_1 = 0, 1, \ldots, n-1$ denotes the column index of the array $O_{n1}$, and $k_1 = 0, 1, \ldots, n-1$ denotes that all elements in the $k_1$th column of the array $O_{n1}$ equal $k_1$; as n is a prime, let a modular n of xn equal 0 if $a_{\alpha_1,\beta_1}$ is a multiple of n, namely $a_{\alpha_1,\beta_1} = xn (\text{mod } n) = 0$, where x could be any integer, and calculate each element of each permutation of the orbit leader array $O_{n1}$ by:

$$a_{\alpha_1,\beta_1}(k) = [(\alpha_1+1)\times(\beta_1-k_1)+k_1](\text{mod } n) \quad (i)$$

$$O_{n1}(k) = \{o_0, o_1, \ldots, o_{n-2}\} = \{\{a_{\alpha_1,\beta_1}(k_1)\}_{\alpha_1=0}^{n-2}\}_{\beta_1=0}^{n-1} (k_1=0,1,\ldots,n-1) \quad (ii)$$

Method 2: A Permutation Contains No Element 0

Let $a_{\alpha_2,\beta_2} \in Z_n^1 = \{1, 2, \ldots, n\}$ denote an element in the $\alpha_2$th row and the $\beta_2$th column of an array $O_{n2}$, where $\alpha_2 = 1, 2, \ldots, n-1$ denotes the row index of the array $O_{n2}$, $\beta_2 = 1, 2, \ldots, n$ denotes the column index of the array $O_{n2}$, and $k_2 = 1, 2, \ldots, n$ denotes that all elements in the $k_2$th column of the array $O_{n2}$ equal $k_2$; as n is a prime, let a modular n of xn equal n if $a_{\alpha_2,\beta_2}$ is a multiple of n, namely $a_{\alpha_2,\beta_2} = xn (\text{mod } n) = n$, where x could be any integer, and calculate an element of a permutation of the orbit leader array $O_{n2}$ by:

$$a_{\alpha_2,\beta_2}(k_2) = [\alpha_2(\beta_2-k_2)+k_2](\text{mod } n) \quad (iii)$$

$$O_{n2}(k_2) = \{o_1, o_2, \ldots, o_{n-1}\} = \{\{a_{\alpha_2,\beta_2}(k_2)\}_{\alpha_2=1}^{n-1}\}_{\beta_2=1}^{n} \quad (k_2=1,2,\ldots,n) \quad (iv)$$

As $k_2 = n$, equations (iii) and (iv) in method 2 can be simplified as:

$$a_{\alpha,\beta}(n) = [\alpha \cdot \beta](\text{mod } n) \text{ for } \alpha=1,2,\ldots,n-1 \text{ and } \beta=1,2,\ldots,n \quad (v)$$

$$O_n = \{o_1, o_2, \ldots, o_{n-1}\} = \{\{a_{\alpha,\beta}(n)\}_{\beta=1}^{n}\}_{\alpha=1}^{n-1} = [[\alpha \cdot \beta]_{\beta=1}^{n}]_{\alpha=1}^{n-1}(\text{mod } n) = \{\alpha \cdot o_1\}_{\alpha=1}^{n-1}(\text{mod } n) \quad (vi)$$

Calculation of equation (vi) is the same as that of $O_n$ in Theorem 2.

Example 2

Let $n=5$, according to the design method 1, if $a_{\alpha_1,\beta_1} \in Z_n^0$, $c_0 = o_0 = e = [01234]$, and each element of each permutation of $O_{n1}(k_1)$ is calculated by $a_{\alpha_1,\beta_1}(k_1) = [(\alpha_1+1)\times(\beta_1-k_1)+k_1] (\text{mod } n)$, different orbit leader arrays can be calculated by $O_{n1}(k_1)$ in equation (ii) as follows as $k_1 = 0, 1, 2, 3, 4$:

$$\left\{\begin{array}{c}01234,\\02413,\\03142,\\04321\end{array}\right\}_{k_1=0} \left\{\begin{array}{c}01234,\\41302,\\31420,\\21043\end{array}\right\}_{k_1=1} \left\{\begin{array}{c}01234,\\30241,\\14203,\\43210\end{array}\right\}_{k_1=2} \left\{\begin{array}{c}01234,\\24130,\\42031,\\10432\end{array}\right\}_{k_1=3} \left\{\begin{array}{c}01234,\\13024,\\20314,\\32104\end{array}\right\}_{k_1=4}$$

Performing a cyclic-left-shift composite operation function $(l_1)^4$ or a cyclic-right-shift composite operation function $(r_5)^4$ on the above five orbit leader arrays of $O_{n1}(k_1)$ ($k_1=0, 1, 2, 3, 4$) respectively, ten equivalent permutation code sets can be obtained.

Let $n=5$, according to the design method 2 and a corresponding simplified alternative, if $a_{\alpha_2,\beta_2} \in Z_n^1$, $c_1 = o_1 = e = [12345]$, and each element of each permutation is calculated by (iii) $a_{\alpha_2,\beta_2}(k_2) = [\alpha_2(\beta_2-k_2)+k_2](\text{mod } n)$ or (v) $a_{\alpha,\beta}(n) = [\alpha \cdot \beta](\text{mod } n)$, different orbit leader arrays can be calculated by $O_{n2}(k_2)$ in equation (iv) and $O_n$ in equation (vi) as follows as $k_2 = 1, 2, 3, 4, 5$:

$$\left\{\begin{array}{c}12345,\\13524,\\14235,\\15432\end{array}\right\}_{k_2=1} \left\{\begin{array}{c}12345,\\52413,\\42531,\\32154\end{array}\right\}_{k_2=2} \left\{\begin{array}{c}12345,\\41352,\\25314,\\54321\end{array}\right\}_{k_2=3}$$

$$\left\{\begin{array}{c}12345,\\35241,\\53142,\\21543\end{array}\right\}_{k_2=4} \left\{\begin{array}{c}12345,\\24135,\\31425,\\43215\end{array}\right\}_{k_2=5} O_5 = \left\{\begin{array}{c}12345,\\24135,\\31425,\\43215\end{array}\right\}$$

Performing a cyclic-left-shift composite operation function $(l_1)^4$ or a cyclic-right-shift composite operation function $(r_5)^4$ on five orbit leader arrays of $O_{n2}(k_2)$ ($k_2=1, 2, 3, 4, 5$) and a simplified orbit leader array $O_5$ respectively, 12 permutation code sets obtained are equivalent to the code set of the $(n, n(n-1), n-1)$ permutation group code obtained by composition operations, namely, for $k=1, 2, 3, 4, 5$, $$P_5 = C_5 O_5 = \{(r_5)^4 O_{52}(k_2)\} = \{(l_1)^4 O_{52}(k_2)\} =$$

$$\{(r_5)^4 O_5\} = \{(l_1)^4 O_5\} = \left\{\begin{array}{cccc}12345, & 24135, & 31425, & 43215,\\23451, & 35241, & 42531, & 54321,\\34512, & 41352, & 53142, & 15432,\\45123, & 52413, & 14253, & 21543,\\51234, & 13524, & 25314, & 32154\end{array}\right\}$$

Part 2: Structure Design of a Generator of the $(n, n(n-1), n-1)$ Permutation Group Code Based on Coset Partition Illustration of the generator comprises 4 parts: generator architecture, orbit leader array generator, flash memory and cyclic-bidirectional-shift register group.

Binary Expression of a Permutation:

If m-bit binary data are used to express elements of a permutation with a length of n, the permutation can be described by a binary array of $m \times n$, and $2^{m-1}+1 \leq n \leq 2^m$.

Generator Architecture of the Presented Code Set

Figure 1:
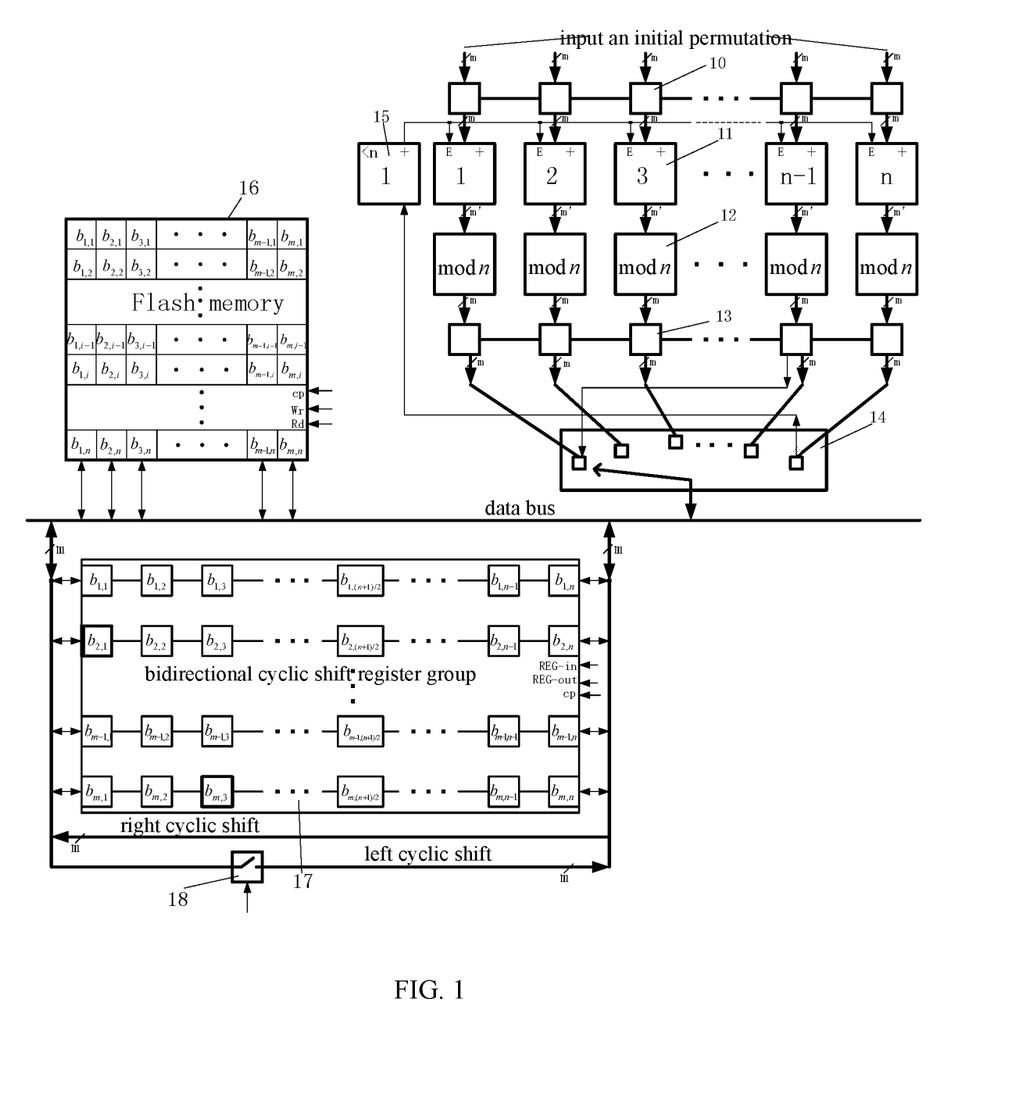
FIG. 1 is an overall block diagram of a generator for a (n,n(n−1),n−1) permutation group code of the invention.

As in FIG. 1, the generator architecture of the presented code set is formed by 3 parts: an orbit leader array generator, a flash memory and a cyclic-bidirectional-shift register group. A schematic circuit of the orbit leader array generator is designed based on equations (i)~(vi), a specific working process is performing an operation of $\{\alpha o_1\}_{\alpha=1}^{n-1}(\text{mod } n)$ to generate an orbit leader array $O_n=\{o_1, o_2, \ldots, o_{n-1}\}$ containing n−1 permutations. The flash memory is operable for storing an output result $O_n=\{o_1, o_2, \ldots, o_{n-1}\}$ of the orbit leader array generator and an output result $P_n=\{\{(l_1)^{n-1}o_1\}, \{(l_1)^{n-1}o_2\}, \ldots, \{(l_1)^{n-1}o_{n-1}\}\}$ or $P_n=\{\{(r_n)^{n-1}o_1\}, \{(r_n)^{n-1}o_2\}, \ldots, \{(r_n)^{n-1}o_{n-1}\}\}$ of the cyclic-bidirectional-shift register group. The cyclic-bidirectional-shift register group is operable for performing an operation on a permutation by a cyclic-left-shift composite operation function $(l_1)^{n-1}$ or a cyclic-right-shift composite operation function $(r_n)^{n-1}$ (specifically, performing cyclic shift on a permutation $o_\alpha$ to a left or right direction for n−1 times) calculating an orbit $\{(l_1)^{n-1}o_\alpha\}$ or $\{(r_n)_{n-1}o_\alpha\}$ of an orbit leader permutation $o_\alpha$, where $\alpha=1, 2, \ldots, n-1$. For an orbit $\{(l_1)^{n-1}o_\alpha\}$ or $\{(r_n)^{n-1}o_\alpha\}$ contains n permutations, a (n,n(n−1),n−1) permutation group code based on coset partition can be generated by repeating generating process of each orbit for n−1 times, and a specific calculating equation thereof is: $P_n=C_nO_n=\{(l_1)^{n-1}O_n\}=\{\{(l_1)^{n-1}o_1\}, \{(l_1)^{n-1}o_2\}, \ldots, \{(l_1)^{n-1}o_{n-1}\}\}$ or $P_n=C_nO_n=\{(r_n)^{n-1}O_n\}=\{\{(r_n)^{n-1}o_1\}, \{(r_n)^{n-1}o_2\}, \ldots, \{(r_n)^{n-1}o_{n-1}\}\}$.

Figure 2:
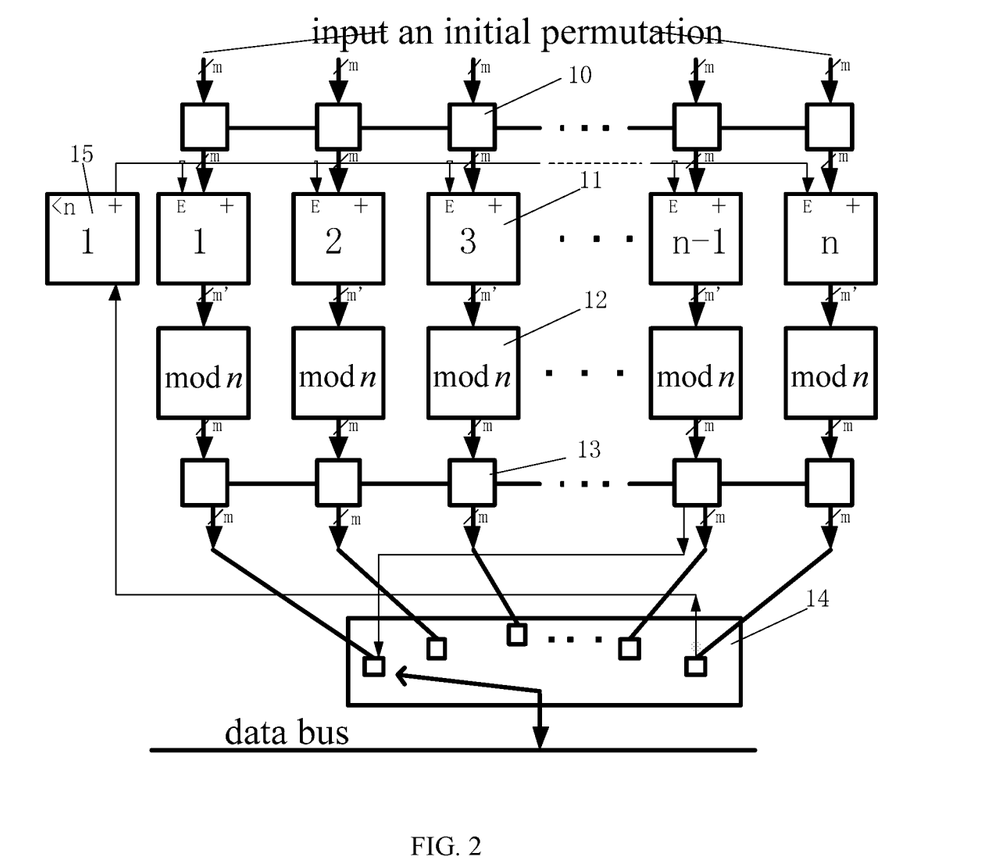
FIG. 2 is a schematic diagram of an orbit leader array generator of the invention.

The orbit leader array generator is shown in FIG. 2 and structural parameters thereof are designed as follows with an optimum circuit structure. To avoid amplitude values attenuating to 0 under fading interference conflicting with code element 0 in a code, set $a_{\alpha,\beta} \in Z_n^1$ to ensure absence of element 0 in each permutation code, where n is an arbitrary prime. To facilitate code element tracking, let $k_2=n$ which means that all elements of the last column of the orbit leader array are the same with a value of n, so that equation (iii) can be simplified to an equation (v): $a_{\alpha,\beta}(n)=[\alpha \cdot \beta](\text{mod } n)$, and calculation of the orbit leader array $O_n$ can be simplified to $O_n=\{o_1, o_2, \ldots, o_{n-1}\}=\{\alpha o_1\}_{\alpha=1}^{n-1}(\text{mod } n)$, where $\alpha=1, 2, \ldots, n-1$ representing that n−1 permutations are contained in the orbit leader array, and $\beta=1, 2, \ldots, n$ representing that n elements are contained in each permutation.

The orbit leader array generator is operable for performing an operation of $O_n=\{\alpha o_1\}_{\alpha=1}^{n-1}(\text{mod } n)=\{o_1, 2o_1, \ldots, (n-1)o_1\}(\text{mod } n)$ to generate n−1 orbit leader permutations as an initial permutation is $o_1=e=[1 2 \ldots n]$, and transmitting each of the permutations to the flash memory right after it is generated.

The orbit leader array generator further comprises 5 parts: n parallel running input buffers (10), n parallel running positive integer adders (11), n parallel running mod n calculators (12), n parallel running output buffers (13), an n-input single-output switch (14) and an enable signal generator (15). Working principle of each part is described below.

The n parallel running input buffers (10) are formed by n m-bit binary registers, each binary register stores one of n input data as an m-bit binary data, an input and an output of each register are connected to m parallel data lines respectively, and the orbit leader generator starts to work after inputting the initial permutation $o_1=e=[1 2 \ldots n]$ into the n parallel running input buffers (10). The n parallel running positive integer adders are operable for converting multiple operations in $O_n=\{\alpha o_1\}_{\alpha=1}^{n-1}=\{o_1, 2o_1, \ldots, (n-1)o_1\}$ to accumulating operations on each element of the initial permutation $o_1=[1 2 \ldots n]$, namely, mainly performing an operation of $\{\alpha o_1\}_{\alpha=1}^{n-1}$. Initial identity permutation requires no accumulation and can be transmitted directly to an output buffer, so that calculation of the set $\{\alpha o_1\}_{\alpha=1}^{n-1}$ needs n−2 accumulations. Each positive integer adder is formed by m' binary full-adders and an m'-bit B register, with m parallel input data lines and m' parallel output data lines, and $m < m' \leq \lceil \log_2(n-1)^2 \rceil$, an input of the binary full-adder is operable for receiving data from the input buffer, another input of the binary full-adder is connected to an output of the B register, and an output of the binary full-adder is connected to an input of the B register. As an enable signal E=1, each adder performs an addition between a last summation result (data in the B register) and an input of a corresponding parallel running input buffer (10), stores a result thereof in the B register and transmits the result to a corresponding parallel running mod n calculator (12); as the enable signal E=0, the n parallel running positive integer adders do not work.

The n parallel running mod n calculators (12) are operable for performing an operation of $\{\alpha o_1\}_{\alpha=1}^{n-1}(\text{mod } n)$, namely, performing mod n operations on data from the B register in the n parallel running positive integer adders, each mod n calculator is formed by a two-input single-output general mod n calculator, an m-bit C register and an m-bit D register, with m' parallel input data lines and m parallel output data lines, an input of the general mod n calculator is connected to the output of the m'-bit B register through m' parallel input data lines, another input of the general mod n calculator is connected to an output of the m-bit C register through m parallel output data lines, an output of the general mod n calculator is facilitated with m parallel output data lines, the m-bit C register is operable for storing and maintaining an m-bit binary value corresponding to n, the m-bit D register is operable for storing output values of said general mod n calculator, and a data |x| stored in the m-bit D register is output as it is not 0, otherwise a data stored in the m-bit C register is output.

The n parallel running output buffers (13) are formed by n m-bit registers, with the same structure as the n parallel running input buffers (10), operable for storing current orbit leader permutation, and as the (n−1)th buffer of the n parallel running output buffers (13) is prepared with current data, a signal is transmitted the first switch of the n-input single-output switch (14) so that this first switch is on.

The n-input single-output switch (14) is operable for serially transmitting each of the n data from the n parallel running output buffers (13) to a bus. m data lines of each output buffer are connected to an m-paralleled bus by a corresponding turn-on switch, the signal of closing a switch is transmitted to the first switch of the n-input single-output switch (14) as the (n−1) th buffer of the n parallel running output buffers is prepared with current data, and as the n th switch of the n-input single-output switch is on, the final data of a codeword is transmitted to the flash memory by the bus and a high level signal is transmitted to an input of the enable signal generator (15).

The enable signal generator (15) is operable for providing enable signals for the n parallel running positive integer adders (11) and formed by a binary plus 1 counter and a monostable flip-flop, with an input line and an output line which outputs a low level at a normal state, an input of the enable signal generator is connected to an output controlling signal line of the nth switch of the n-input single-output switch (14), an output of the enable signal generator is connected to enable terminals of the n parallel running positive integer adders (11), as the n th switch of the n-input single-output switch (14) is on, the enable signal generator (15) is enabled, the binary plus 1 counter performs an add-one operation, the monostable flip-flop generates a high level impulse with a width of a cp and transmits it to enable terminals of the n parallel running positive integer adders (11) to set E=1, and as the nth switch of the n-input single-output switch (14) is oft the enable signal generator (15) is disabled and E=0 is maintained. As the binary plus 1 counter performs n−1 add-one operations, the enable signal generator (15) outputs a low level.

Figure 3:
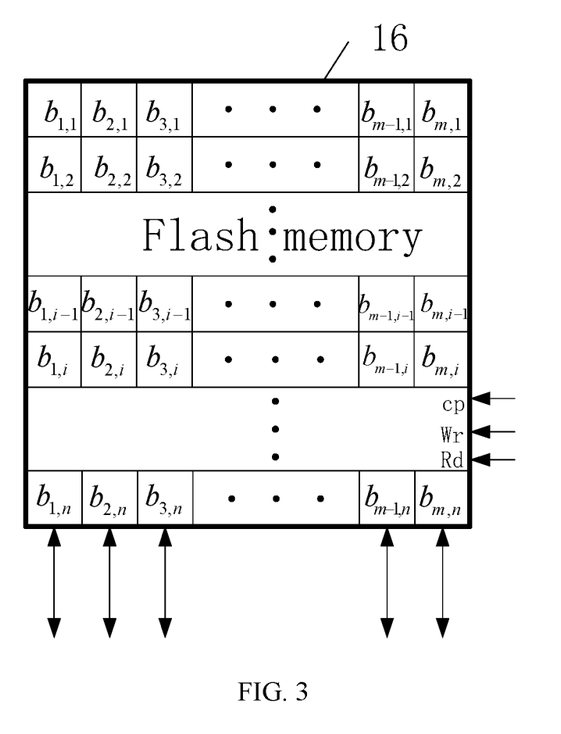
FIG. 3 is a schematic diagram of a flash memory of the invention.

The flash memory is shown in FIG. 3, which may be a read only (ROM), programmable read-only memory (PROM), an erasable programmable read-only memory (EPROM) or an electrically erasable programmable read-only memory ($E^2$PROM).

In the flash memory (16), each element of a permutation is represented by an m-bit binary data, e.g. the first element of a permutation is represented by an m-bit binary data $b_{1,1}$, $b_{2,1}$, ..., $b_{m-1,1}$, $b_{m,1}$, the last element of a permutation is represented by an m-bit binary data $b_{1,n}$, $b_{2,n}$, ..., $b_{m-1,n}$, $b_{m,n}$, $b_{i,j}$ is binary 0 or 1, i=0, 1, ..., m−1, and j=0, 1, ..., n−1. m-bit binary data of an element of a permutation occupies m memory cells defined as an element storage word, a permutation occupies n element storage words, n−1 orbit leader permutations occupy n(n−1) element storage words, and n(n−1) permutation codewords occupy $n^2(n-1)$ element storage words. The flash memory (16) is facilitated with an m-bit parallel data input and an m-bit parallel data output. An m-bit data of an element storage word are input in parallel as Wr=1, an m-bit data of an element storage word are output in parallel as Rd=1, and the flash memory (16) is disabled as Wr=0 and Rd=0.

Figure 4:
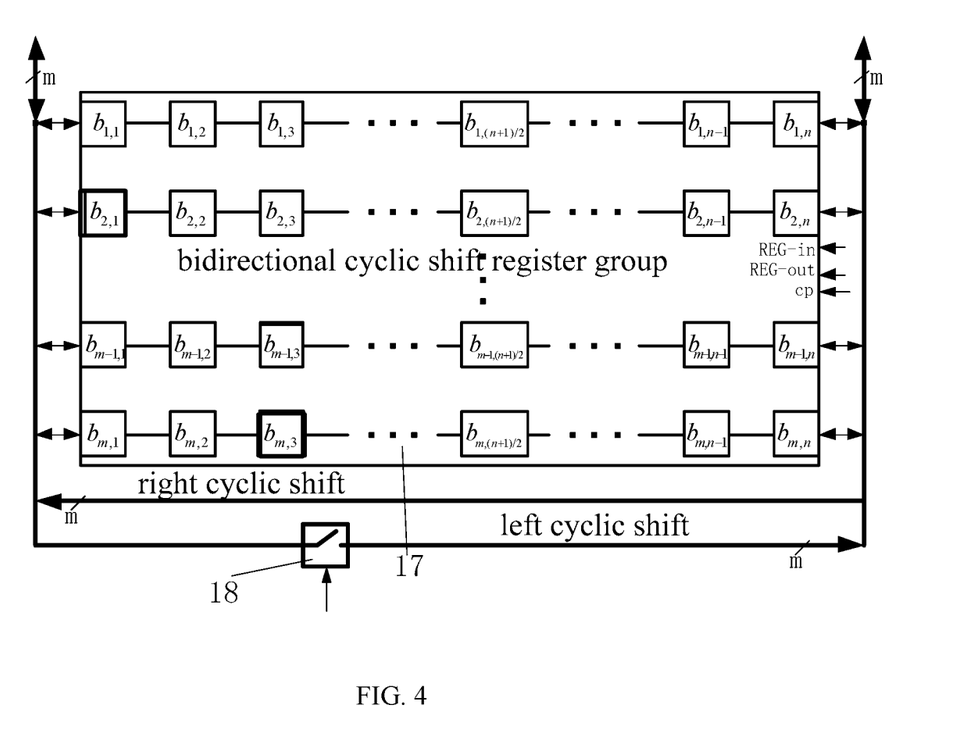
FIG. 4 is a schematic diagram of a cyclic-bidirectional-shift register group of the invention.

The cyclic-bidirectional-shift register group is shown in FIG. 4. The cyclic-bidirectional-shift register group (17) is operable for performing an operation on a permutation by a cyclic-left-shift composite operation function $(l_1)^{n-1}$ or a cyclic-right-shift composite operation function $(r_n)^{n-1}$ calculating an orbit $\{(l_1)^{n-1}o_\alpha\}$ or $\{(r_n)^{n-1}o_\alpha\}$ of an orbit leader permutation $o_\alpha$, and a code set $\{(l_1)^{n-1}O_n\}$ or $\{(r_n)^{n-1}O_n\}$. Each element of an n-dimensional permutation vector can be expressed by an m-dimensional binary sequence and an n-dimensional permutation vector can be mapped into an m×n-dimensional binary array, corresponding to an m×n flip-flop array. A bidirectional register capable of shifting in both a left direction and a right direction cyclically is formed by n flip-flops in each of the m rows, namely, n flip-flops form a cyclic-bidirectional-shift register, m cyclic-bidirectional-shift registers are needed to form a cyclic-bidirectional-shift register group, e.g. the first cyclic-bidirectional-shift register is operable for storing an n-bit binary data $b_{1,1}$, $b_{1,2}$, ..., $b_{1,n-1}$, $b_{1,n}$ and the m th cyclic-bidirectional-shift register is operable for storing an n-bit binary data $b_{m,1}$, $b_{m,2}$, ..., $b_{m,n-1}$, $b_{m,n}$ (it should be noted that the array herein is m×n dimensional, and the flash memory (16) corresponds to an array of n×m). A switch (18) is serially connected to each of the cyclic-left-shift loops, m switches operates in parallel, a cyclic-left-shift operation is performed on m data in parallel by connecting the m switches, and a left-shift input operation and a left-shift output operation are performed on m data in parallel by disconnecting the m switches, and two inputs REG-in and REG-out are facilitated to provide four groups of control signals 00, 01, 10 and 11 corresponding to four working states of the cyclic-bidirectional-shift register group: left-shift input, left-shift output, cyclic-left-shift and cyclic-right-shift. Working process of the cyclic-bidirectional-shift register group (17) is described below.

Process a: input a permutation. As REG-in=0, REG-out=0 and Rd=1, the m parallel switches (18) of the cyclic-left-shift loops are disconnected, the first orbit leader permutation of the flash memory (16) is transmitted to the cyclic-bidirectional-shift register group (17), namely, the cyclic-bidirectional-shift register group performs an left-shift-input operation on m-bit binary in parallel in n times.

Process b: generate a new permutation by cyclic-left-shift. As REG-in=0 and REG-out=1, the m parallel switches (18) of the cyclic-left-shift loops are connected, and the cyclic-bidirectional-shift register group (17) performs a cyclic-left-shift operation on m-bit binary in parallel in n times to generate a new permutation.

Process c: output a permutation. As REG-in=1, REG-out=0 and Wr=1, the m parallel switches (18) of the cyclic-left-shift loops are connected, the cyclic-bidirectional-shift register group (17) performs the following two operations: transmitting a current permutation generated by Process b to the flash memory (16) by the left-shift-output operation on m-bit binary in parallel in n times, and performing a cyclic-left-shift operation on m-bit binary in parallel in n times, so that a permutation generated by Process b may be reserved.

Process d: generate an orbit $\{(l_1)_{n-1}o_\alpha\}$. It is formed by a combination of Process b and Process c with the m parallel switches (18) closed. Process b and Process c work alternately: this is that during an impulse of cp, REG-in=0 and REG-out=1, the cyclic-bidirectional-shift register group (17) performs a cyclic-left-shift operation of m-bit in parallel to generate a new permutation, and during each of the following n impulses of cp, REG-in=1, REG-out=0 and Wr=1, the cyclic-bidirectional-shift register group (17) simultaneously performs a left-shift operation to output a current permutation to the flash memory (16) for storage and a cyclic-left-shift operation to maintain this permutation by m-bit in parallel in n times. Process d is equivalent to performing an operation of $(l_1)^{n-1}$ on an orbit leader permutation $o_\alpha$ to generate an orbit $\{(l_1)^{n-1}o_\alpha\}$, and storing n−1 permutations generated by the orbit $\{(l_1)^{n-1}o_\alpha\}$ in the flash memory (16).

Process e: generate a code set $\{(l_1)^{n-1}O_n\}$. It is formed by a combination of Process a and Process d, and a code set $\{(l_1)^{n-1}O_n\}$ of a (n,n(n−1),n−1) permutation group code based on coset partition is generated by repeating Process e for n−1 times.

Process b': generate a new permutation by cyclic-right-shift. As REG-in=1 and REG-out=1, the m parallel switches (18) of the cyclic-left-shift loops are disconnected, and the cyclic-bidirectional-shift register group (17) performs a cyclic-right-shift operation on m-bit in parallel of length n to generate a new permutation.

Process d': generate an orbit $\{(r_n)^{n-1}o_\alpha\}$. It is formed by a combination of Process b' and Process c, equivalent to generating an orbit $\{(r_n)^{n-1}o_\alpha\}$ of a permutation $o_\alpha$ and storing the orbit $\{(r_n)^{n-1}o_\alpha\}$ in the flash memory (16).

Process e': generate a code set $\{(r_n)^{n-1}O_n\}$. It is formed by a combination of Process a and Process d', and a code set $\{(r_n)^{n-1}O_n\}$ of a (n,n(n−1),n−1) permutation group code based on coset partition is generated by repeating Process e' for n−1 times.

While preferred embodiments of the invention have been described above, the invention is not limited to disclosure in the embodiments and the accompanying drawings. Any changes or modifications without departing from the spirit of the invention fall within the scope of the invention.

What is claimed is:

1. A method of constructing (n, n(n−1),n−1) permutation group codes based on coset partition using a generator including an orbit leader array generator, a flash memory, and a cyclic-bidirectional-shift register group, wherein the orbit leader array generator is operable for performing an operation to generate orbit leader permutations, wherein the flash memory is operable for storing output results of the orbit leader array generator and the cyclic-bidirectional-shift register group, and wherein the cyclic-bidirectional-shift register group is operable for performing an operation acting on a permutation, the method comprising:

receiving a set of data via a wireless communication or a power line carrier communication;

constructing a permutation code based on the set of data received with a code length of n, a minimum distance of n−1, and a code size of n(n−1), using $$P_n = \{\{p_{\beta\alpha}\}_{\beta=1}^n\}_{\alpha=1}^{n-1} = C_n O_n = \{\{C_n o_1 C_n o_2, \ldots, C_n o_{n-1}\}, \ldots, \{\{c_\beta \circ o_\alpha\}_{\beta=1}^n\}_{\alpha=1}^{n-1},$$

wherein $P_n = C_n O_n$ represents that $C_n$ is a coset of a subgroup $O_n$, and $O_n$ is also a coset of a subgroup $C_n$, and wherein $P_n = \{\{C_n o_1\}, \{C_n o_2\}, \ldots, \{C_n o_{n-1}\}\}$ represents dividing $P_n$ into n−1 cosets by the subgroup $C_n$, and each coset $\{C_n o_\alpha\}$ forms an orbit or a cyclic Latin square (C-LS) of a permutation $o_\alpha$, and wherein $P_n = \{\{p_{\beta\alpha}\}_{\beta=1}^n\}_{\alpha=1}^{n-1} = \{\{c_\beta \circ o_\alpha\}_{\beta=1}^n\}_{\alpha=1}^{n-1}$ represents the permutation code, each codeword $p_{\beta\alpha}$ is generated by composition operation of a permutation $c_\beta$ of the subgroup $C_n$ and a permutation $o_\alpha$ of the subgroup $O_n$, $\alpha=1, 2, \ldots n-1$, and $\beta=1, 2, \ldots n$;

generating the permutation code for the set of data based on the constructing step; and transmitting and protecting the set of data by transmitting the permutation code to a receiver terminal via the wireless communication or the power line carrier communication.

2. The method of claim 1, further comprising:

replacing, using the cyclic-bidirectional-shift register group, $C_n$ by a cyclic-left-shift composite operation function $(l_1)^{n-1}$ or a cyclic-right-shift composite operation function $(r_n)^{n-1}$, and converting composition operation of the subgroups $C_n$ and $O_n$ into the cyclic shift operation implemented by hardware circuit; and the replacing $C_n$ by $(l_1)^{n-1}$ or $(r_n)^{n-1}$ further comprises: implementing an orbit $\{C_n o_\alpha\}$ of a permutation $o_\alpha \in O_n$ by an equivalent expression $\{C_n o_\alpha\} = \{(r_n)^{n-1} o_\alpha\} = \{(l_1)^{n-1} o_\alpha\}$, where $\alpha=1, 2, \ldots n-1$, and implementing $P_n = C_n O_n$ using one of:

$$P_n = C_n O_n = \{(r_n)^{n-1} O_n\} = \{\{(r_n)^{n-1} o_1\}, \{(r_n)^{n-1} o_2\}, \ldots, \{(r_n)^{n-1} o_{n-1}\}\} \text{ or}$$

$$P_n = C_n O_n = \{(l_n)^{n-1} O_n\} = \{\{(l_n)^{n-1} o_1\}, \{(l_n)^{n-1} o_2\}, \ldots, \{(l_n)^{n-1} o_{n-1}\}\}.$$

3. The method of claim 1, wherein the subgroup $O_n$ is equivalent to an orbit leader array, and a construction method thereof comprises:

if a permutation contains element 0:

letting $\alpha_{\alpha_1, \beta_1} \in Z_n^0 = \{0, 1, \ldots, n-1\}$ denote an element in the $\alpha_1$ th row and the $\beta_1$ th column of an array $O_{n1}$, where $\alpha_1 = 0, 1, \ldots, n-2$ denotes the row index of the array $O_{n1}$, $\beta_1 = 0, 1, \ldots, n-1$ denotes the column index of the array $O_{n1}$, and $k_1 = 0, 1, \ldots, n-1$ indicates that all elements in the $k_1$ th column of the array $O_{n1}$ equal $k_1$;

setting $\alpha_{\alpha_1, \beta_1} = xn \pmod{n} = 0$ as n is a prime, where x is an integer; and calculating each element of each permutation of the array $O_{n1}$ by $\alpha_{\alpha_1, \beta_1}[(\alpha_1+1) \times (\beta_1-k_1) + k_1] \pmod{n}$ and calculating all permutations of the array $O_{n1}$ by $O_{n1}(k_1) = \{o_0, o_1, \ldots, o_{n-2}\}, = \{\{a_{\alpha_1\beta_1}((k_1)\}_{\alpha_1=0}^{n-2}\}_{\beta_1=0}^{n-1}$; or if a permutation contains no element 0:

setting $a_{\alpha_2,\beta_2} \in Z_n^1 = \{1, 2, \ldots, n\}$ representing an element in the $\alpha_2$ th row and the $\beta_2$ th column of an array $O_{n2}$, where $\alpha_2 = 1, 2, \ldots, n-1$ representing row index of the array $O_{n2}$, $\beta_2 = 1, 2, \ldots, n$ representing column index of the array $O_{n2}$, and $k_2 = 1, 2, \ldots, n$ representing that all elements in the $k_2$ th column of the array $O_{n2}$ equal $k_2$;

setting $a_{\alpha_2,\beta_2} = xn \pmod{n} = n$ as n is a prime, where x is an integer; and calculating each element of each permutation of the array $O_{n2}$ by $a_{\alpha_2,\beta_2}(k_2) = [\alpha_2(\beta_2-k_2) + k_2] \pmod{n}$ and calculating all permutations of the array $O_{n2}$ by $O_{n2}(k_2) = \{o_1, o_2, \ldots, o_{n-1}\} = \{\{a_{\alpha_2\beta_2}(k_2)\}_{\alpha_2=1}^{n-1}\}_{\beta_2=1}^{n}$; and setting $k_2 = n$ and $a_{\alpha,\beta} \in Z_n^1 = \{1, 2, \ldots, n\}$, calculating each element of each permutation of the array $O_{n2}$ by a simplified expression $a_{\alpha,\beta}(n) = [\alpha \cdot \beta] \pmod{n}$ and calculating all permutations of the array $O_{n2}$ by a simplified expression $O_n = \{o_1, o_2, \ldots o_{n-1}\} = \{\alpha o_1\}_{\alpha=1}^{n-1} \pmod{n}$, wherein $o_1 = e = [a_1 \ a_2 \ \ldots \ a_n] = [12 \ \ldots \ n]$, $a_1, a_2, \ldots, a_n \in Z_n^1$, $\alpha = 1, \ldots, n-1$ and $\beta 1, 2, \ldots n$.

4. A generator of an (n,n(n−1),n−1) permutation group code for a set of data received via a wireless communication or a power line carrier communication based on coset partition, comprising:

an orbit leader array generator, a flash memory, and a cyclic-bidirectional-shift register group, wherein said orbit leader array generator is operable for performing a first operation of $O_n = \{\alpha o_1\}_{\alpha=1}^{n-1} \pmod{n}$ to generate n−1 orbit leader permutations;

said flash memory is operable for storing output results of said orbit leader array generator and said cyclic-bidirectional-shift register group; and said cyclic-bidirectional-shift register group is operable for performing a second operation of $(l_1)^{n-1}$ or $(r_1)^{n-1}$ acting on a permutation by calculating the orbit $\{(l_1)^{n-1} o_\alpha\}$ or $\{(r_n)^{n-1} o_\alpha\}$ of an orbit leader permutation $o_\alpha$ and a code set $\{(l_1)^{n-1} O_n\} \{(r_n)^{n-1} O_n\}$, where $\alpha=1, 2, \ldots, n-1$, wherein the generator generates the permutation group code for the set of data based on the first operation and the second operation, and transmits and protects the set of data by transmitting the permutation group code to a receiver terminal via the wireless communication or the power line carrier communication.

5. The generator of the (n,n(n−1),n−1) permutation group code of claim 4, wherein said orbit leader array generator is operable for calculating n−1 orbit leader permutations by $O_n = \{\alpha o_1\}_{\alpha=1}^{n-1} \pmod{n} = \{o_1, 2o_1, \ldots, (n-1)o_1\} \pmod{n}$ as an initial input permutation is an identity permutation expressed by $o_1 = e = [12 \ldots n]$ and storing calculating results in ROM thereof; and said orbit leader array generator further comprises n parallel running input buffers, n parallel running positive integer adders, n parallel running mod n calculators, n parallel running output buffers, an n-input single-output switch and an enable signal generator, wherein said n parallel running input buffers are formed by n m-bit binary registers, an input and an output of each register are connected to m parallel data lines respectively, and $2^{m-1}+1 \leq n \leq 2^m$;

said n parallel running positive integer adders are operable for performing an operation of $\{\alpha o_1\}_{\alpha=1}^{n-1}$ each positive integer adder is formed by m' binary full-adders and an m'-bit B register, with m parallel input data lines and m' parallel output data lines, and $m < m' \leq \lceil \log_2 (n-1)^2 \rceil$, and an input of said binary full-adder is operable for receiving data from said input buffer, another input of said binary full-adder is connected to an output of said B register, an output of said binary full-adder is connected to an input of said B register, and said n parallel running positive integer adders are enabled as an enable signal E=1 and disabled as the enable signal E=0;

said n parallel running mod n calculators are operable for performing an operation of $\{\alpha o_1\}_{\alpha=1}^{n-1}$ (mod n), each mod n calculator is formed by a two-input single-output general mod n calculator, an m-bit C register and an m-bit D register, with m' parallel input data lines and m parallel output data lines, an input of said general mod n calculator is connected to the output of said m'-bit B register through m' parallel input data lines, another input of said general mod n calculator is connected to an output of said m-bit C register through m parallel output data lines, an output of said general mod n calculator is facilitated with m parallel output data lines, said m-bit C register is operable for storing and maintaining an m-bit binary value corresponding to n, said m-bit D register is operable for storing output values of said general mod n calculator, and a data stored in said m-bit D register is output as it is not 0, otherwise a data stored in said m-bit C register is output;

said n parallel running output buffers are formed by n m-bit registers, an input and an output of each m-bit register are connected to m parallel data lines respectively, and as the (n−1)th buffer of said n parallel running output buffers is prepared with current data, this buffer sends a signal to the first switch of said n-input single-output switch;

said n-input single-output switch is operable for serially transmitting each of then data from said n parallel running output buffers to a bus, m data lines of said output buffer are connected to an m-paralleled bus by connecting a corresponding switch, a connecting signal of said first switch of said n-input single-output switch is a control signal output from said (n−1)th buffer of said n parallel running output buffers, and a high level signal is transmitted to an input of said enable signal generator as the n th switch of said n-input single-output switch is on;

said enable signal generator is operable for providing enable signals for said n parallel running positive integer adders and formed by a binary plus 1 counter and a monostable flip-flop, with an input signal line and an output signal line of maintaining a low level at a normal state, an input of said binary plus 1 counter is connected to an output signal line of said n th switch of said n-input single-output switch and receives a control signal as said n th switch is on, said binary plus 1 counter performs an add-one operation and said monostable flip-flop generates a high level impulse with a width of a cp, and transmits said impulse to enable terminals of said n parallel running positive integer adders through the output line, and as said binary plus 1 counter performs n−1 add-one operations, said monostable flip-flop generates no impulse and said enable signal generator outputs a low level.

6. The generator of the (n,n(n−1),n−1) permutation group code of claim 4, wherein said cyclic-bidirectional-shift register group is operable for realizing an orbit $\{(l_1)^{n-1}O_\alpha\}$ or $\{(r_n)^{n-1}O_\alpha\}$ a code set $\{(l_1)^{n-1}O_n\}$ or $\{(r_n)^{n-1}O_n\}$ and formed by a flip-flop array of m rows and n columns, a bidirectional register capable of cyclic-shifting to both the left and the right is formed by n flip-flops in each row of m rows, each of m switches is connected to each of the cyclic-left-shift loops, m switches operates in parallel, m binary are cyclic-left-shifted in parallel through closing m switches, and m binary are left-shifted to input or output in parallel by opening m switches, and two ports REG-in and REG-out are facilitated to provide four groups of control signals 00, 01, 10 and 11 corresponding to four working states of said cyclic-bidirectional-shift register group: left-shift-input, left-shift-output, cyclic-left-shift and cyclic-right-shift.

7. A method of constructing (n, n(n−1), n−1) permutation group codes based on coset partition using the generator of claim 4, the method comprising:

receiving a set of data via a wireless communication or a power line carrier communication;

constructing a permutation code based on the set of data received with a code length of n, a minimum distance of n−1, and a code size of n(n−1), using $$P_n=\{\{p_{\beta\alpha}\}_{\beta=1}^{n}\}_{\alpha=1}^{n-1}=C_nO_n=\{\{C_no_1, C_no_2, \ldots, C_no_{n-1}\}\}=\{\{c_{\beta0}o_\alpha\}_{\beta=1}^{n}\}_{\alpha=1}^{n-1},$$

wherein $P_n=C_nO_n$ represents that $C_n$ is a coset of a subgroup $O_n$, and $O_n$ is also a coset of a subgroup $C_n$, wherein $P_n=\{\{C_no_1\}, \{C_no_2\}, \ldots, \{C_no_{n-1}\}\}$ represents dividing $P_n$ into n−1 cosets by the subgroup $C_n$, and each coset $\{C_no_\alpha\}$ forms an orbit or a cyclic Latin square (C-LS) of a permutation $o_\alpha$, and wherein $P_n=\{\{p_{\beta\alpha}\}_{\beta=1}^{n-1}\}_{\alpha=1}^{n-1}=\{\{c_\beta \circ o_\alpha\}_{\beta=1}^{n}\}_{\alpha=1}^{n-1}$ represents the permutation code, each codeword $p_{\beta\alpha}$ is generated by composition operation of a permutation $c_\beta$ of the subgroup $C_n$ and a permutation $o_\alpha$ of the subgroup $O_n$, $\alpha=1, 2, \ldots$ n−1, and $\beta=1, 2, \ldots$ n;

generating the permutation code for the set of data based on the constructing step; and transmitting and protecting the set of data by transmitting the permutation code to a receiver terminal via the wireless communication or the power line carrier communication.

8. The method of claim 7, further comprising:

replacing, using the cyclic-bidirectional-shift register group, $C_n$ by a cyclic-left-shift composite operation function $(l_1)^{n-1}$ or a cyclic-right-shift composite operation function $(r_n)^{n-1}$, and converting composition operation of the subgroups $C_n$ and $O_n$ into the cyclic shift operation implemented by hardware circuit; and the replacing $C_n$ by $(l_1)^{n-1}$ or $(r_n)^{n-1}$ further comprises:

implementing an orbit $\{C_no_\alpha\}$ of a permutation $o_\alpha \in O_n$ by an equivalent expression $\{C_no_\alpha\}=\{(r_n)^{n-1}o_\alpha\}=\{(l_1)^{n-1}o_\alpha\}$, where $\alpha=1, 2, \ldots$ n−1, and implementing $P_n=C_nO_n$ using one of:

$$P_n=C_nO_n=\{(r_n)^{n-1}O_n\}=\{\{(r_n)^{n-1}o_1\}, \{(r_n)^{n-1}o_2\}, \ldots, \{(r_n)^{n-1}o_{n-1}\}\} \text{ or}$$

$$P_n=C_nO_n=\{(l_n)^{n-1}O_n\}=\{\{(l_n)^{n-1}o_1\}, \{(l_n)^{n-1}o_2\}, \ldots, \{(l_n)^{n-1}o_{n-1}\}\}.$$

9. The method of claim 7, wherein the subgroup $o_n$ is equivalent to an orbit leader array, and a construction method thereof comprises:

if a permutation contains element 0:

letting $a_{\alpha_1,\beta_1} \in Z_n^0=\{0, 1, \ldots, n-1\}$ denote an element in the $\alpha_1$ th row and the $\beta_1$ th column of an array $O_{n1}$, where $\alpha_1=0, 1, \ldots, n-2$ denotes the row index of the array $O_{n1}$, $\beta_1=0, 1, \ldots, n-1$ denotes the column index of the array $O_{n1}$ and $k_1$ 0, 1, \ldots, n-1 indicates that all elements in the $k_1$ th column of the array $O_{n1}$ equal $k_1$;

setting $a_{\alpha_1,\beta_1}=xn(\mod n)=0$ as n is a prime, where x is an integer; and calculating each element of each permutation of the array $O_{n1}$ by $a_{\alpha_1,\beta_1}(k_1)=[(\alpha_1+1)\times(\beta_1-k_1)+k_1](\mod n)$ and calculating all permutations of the array $O_{n1}$ by $O_{n1}(k_1)=\{o_0, o_1, \ldots, o_{n-2}\}=\{\{a_{a_1,\beta_1}(k_1)\}_{\alpha_1=0}^{n-2}\}_{\beta_1=0}^{n-1}$; or if a permutation contains no element 0:

setting $a_{\beta_2,\beta_2}\in Z_n^1=\{1, 2, \ldots, n\}$ representing an element in the $\alpha_2$ th row and the $\beta_2$ th column of an array $O_{n2}$, where $\alpha_2=1,2,\ldots,n-1$ representing row index of the array $O_{n2}$, $\beta_2=1, 2, \ldots, n$ representing column index of the array $O_{n2}$, and $k_2=1, 2, \ldots, n$ representing that all elements in the $k_2$ th column of the array $O_{n2}$ equal $k_2$;

setting $a_{\alpha_2,\beta_2}=xn(\mod n)=n$ as n is a prime, where x is an integer; and calculating each element of each permutation of the array $O_{n2}$ by $a_{\alpha_2,\beta_2}(k_2)=[\alpha_2(\beta_2-k_2)+k_2](\mod n)$ and calculating all permutations of the array $O_{n2}$ by $O_{n2}(k_2)$ $\{o_1, o_2, \ldots, o_{n-1}\}=\{\{a_{\alpha_2,\beta_2}(k_2)\}_{\alpha_2=1}^{n-1}\}_{\beta_2=1}^{n}$; and setting $k_2=n$ and $a_{\alpha,\beta}\in Z_n^1=\{1, 2, \ldots, n\}$, calculating each element of each permutation of the array $O_{n2}$ by a simplified expression $a_{\alpha,\beta}(n)=[\alpha\cdot\beta](\mod n)$ and calculating all permutations of the array $O_{n2}$ by a simplified expression $O_n=\{o_1, o_2, \ldots, o_{n-1}\}=\{\alpha o_1\}_{\alpha=1}^{n-1}(\mod n)$, wherein $o_1=e=[a_1 a_2 \ldots a_n]=[1 2 \ldots n]$, $a_1, a_2, \ldots, a_n \in Z_1^1$, $\alpha=1, 2, \ldots n-1$ and $\beta=1, 2, \ldots n$.

\* \* \* \* \*